United States Patent
Lipperer et al.

(10) Patent No.: US 6,535,059 B2
(45) Date of Patent: Mar. 18, 2003

(54) AMPLIFIER CIRCUIT

(75) Inventors: Georg Lipperer, München (DE); Stephan Weber, München (DE)

(73) Assignee: Infineon Technologies AG, Munich (DE)

(*) Notice: Subject to any disclaimer, the term of this patent is extended or adjusted under 35 U.S.C. 154(b) by 110 days.

(21) Appl. No.: 09/767,802

(22) Filed: Jan. 22, 2001

(65) Prior Publication Data

US 2001/0009388 A1 Jul. 26, 2001

(30) Foreign Application Priority Data

Jan. 20, 2000 (DE) .......................... 100 02 371

(51) Int. Cl.[7] .......................... H03F 1/30; H03F 3/195
(52) U.S. Cl. .......................... 330/85; 330/290
(58) Field of Search .......................... 330/85, 86, 141, 330/281, 282, 302, 290

(56) References Cited

U.S. PATENT DOCUMENTS 4,577,336 A * 3/1986 Kriedt et al. .............. 330/85 X
5,345,191 A * 9/1994 Tanaka ...................... 330/85 X
5,394,113 A * 2/1995 Belcher ..................... 330/85 X
6,323,730 B1 * 11/2001 Hynd ......................... 330/85

FOREIGN PATENT DOCUMENTS

| DE | 197 32 437 C1 | 12/1998 |
| DE | 198 11 839 A1 | 9/1999 |
| DE | 198 27 702 A1 | 12/1999 |

* cited by examiner

Primary Examiner—Steven J. Mottola
(74) Attorney, Agent, or Firm—Laurence A. Greenberg; Werner H. Stemer; Gregory L. Mayback

(57) ABSTRACT

A reference stage is provided in order to compensate for manufacturing tolerances, for example relating to the threshold voltage of a transistor. This reference stage has a transistor which is a physical equivalent of the transistor to be trimmed in a radio-frequency amplifier stage. In particular, this reference transistor has the same electrical direct current characteristics as the amplifier transistor. A reference voltage can be tapped off across a resistor on the reference stage and can be supplied to a control amplifier which uses this reference voltage to set the operating point of the radio-frequency amplifier transistor such that manufacturing tolerances are compensated for. Such radio-frequency power amplifiers are used, for example, as transmit amplifiers in mobile radios.

12 Claims, 1 Drawing Sheet

AMPLIFIER CIRCUIT

BACKGROUND OF THE INVENTION

FIELD OF THE INVENTION

The invention relates to a radio-frequency amplifier circuit which is controlled by setting an operating point.

Electronic components and assemblies are subject to fluctuations and tolerances. Fluctuations in the technological parameters in manufacture lead to tolerances in the characteristic values of components. For example, the DC (direct current) gain B and the small-signal gain β of bipolar transistors are subject to manufacturing tolerances. If the components are subject to stringent accuracy requirements, manufacturing tolerances have to be reduced by complex trimming measures.

Assemblies formed from components which are subject to tolerances are in consequence themselves subject to fluctuations. For example, the characteristic of a power amplifier depends on the characteristic of the internal transistors. In an amplifier which is formed from field-effect transistors, the control characteristic of the power amplifier depends, for example, on the threshold voltage $U_{TO}$ of the field-effect transistors. The threshold voltage $U_{TO}$ of the field-effect transistors is dependent on manufacturing tolerances, as is their transconductance or gradient. For small dimensions, the threshold voltage is dependent, for example, on the channel length and channel width of the field-effect transistor.

Radio-frequency power amplifiers, are used, for example, as transmit amplifiers in systems which operate using the timeslot method (Time Division Multiple Access, TDMA method). One example of a timeslot method such as this is the GSM (Global System for Mobile Communications) mobile radio standard. In methods such as this, the data are transmitted broken down into so-called time slices. To ensure that the output power of the radio-frequency amplifier is zero when it is in the rest state, an amplifier which controls the amplifier must set the control input of the radio-frequency amplifier to a voltage below the threshold voltage of the amplifier transistor. However, this has a disadvantageous influence on the characteristics of the radio-frequency amplifier. There is a dead zone from the regulator quiescent voltage, which is applied to the input of the amplifier, to the inception of the power from the amplifier at the beginning of a transmit timeslot. This dead zone causes a deterioration of the control characteristics of the system.

If the control characteristics of the system are too poor, trimming must be carried out. It is known for such trimming to be carried out on an individual basis, for example using a potentiometer, or for the reference voltage of the regulator to be modified, for example by superimposing an offset. However, implementations of such individual trimming options require additional outlay and are costly.

The need for trimming the control of a power amplifier can also arise as a result of changing environmental conditions, for example, temperature, or as a result of a change in the supply voltage.

SUMMARY OF THE INVENTION

It is accordingly an object of the invention to provide an amplifier circuit which overcomes the above-mentioned disadvantages of the heretofore-known circuits of this general type and which has a compensation for manufacturing tolerances.

With the foregoing and other objects in view there is provided, in accordance with the invention, an amplifier circuit, including:

a power amplifier having a first transistor to be supplied with a supply voltage, the first transistor having a control input for receiving an input signal and a load connection for supplying an output signal;

a control amplifier having an operational amplifier, the operational amplifier having an input and an output, the input being connected to the load connection of the first transistor, the output being connected to the control input of the first transistor; and a reference stage having a second transistor to be supplied with the supply voltage, the second transistor being connected to the operational amplifier for supplying a reference voltage to the operational amplifier.

In other words, the object of the invention is achieved by an amplifier circuit having a power amplifier with a first transistor to which a supply voltage can be supplied, to whose control input an input signal can be supplied and at whose first load connection an output signal can be tapped off, a control amplifier having an operational amplifier whose output is connected to the control input of the first transistor and whose first input is connected to the first load connection of the first transistor, and a reference stage having a second transistor to which the supply voltage c an be supplied and which is connected to the operational amplifier so that a reference voltage can be supplied to this operational amplifier.

A first transistor which can be connected to a supply voltage is specified as the power amplifier. This amplifier is supplied on the input side with an input signal which is to be amplified, and the amplified input signal can be tapped off as the output signal on the output side. This power amplifier is controlled by a control amplifier. The control amplifier has an operational amplifier whose output is connected to the input of the first transistor. Furthermore, the output signal which can be tapped off on the amplifier is fed back to a first input of the operational amplifier. The power amplifier forms the control element for this regulator configuration.

In order to form a reference voltage, a second transistor is provided in a reference stage and is connected to the operational amplifier in order to transmit a reference voltage value. This second transistor is a physical equivalent of the first transistor, so that it can be used for tolerance compensation. The first and second transistors are of the same transistor type, but the second transistor is scaled with respect to the first transistor. The first and second transistors have, in particular, the same electrical characteristics.

A reference signal of the regulator can be supplied to a second input of the operational amplifier via a filter and governs the desired output power from the power amplifier. Together with the control amplifier, the second transistor (which is provided in the reference stage) forms a compensation circuit for the radio-frequency power amplifier, so that the control process can operate without trimming.

In comparison to once-off trimming, the present circuit has the additional advantage that the temperature and operating voltage dependency of the amplifier circuit is also covered and automatically compensated for by the reference stage. Such a temperature change can occur, for example, as a result of operation, or can result from external influences. When the circuit is used as a transmit amplifier in the mobile radio area, the operating voltage depends, for example, on the charge state of the rechargeable battery in the mobile radio appliance.

In one advantageous embodiment of the invention, the power amplifier and the reference stage are provided on the same semiconductor chip. This firstly ensures good matching of the transistors during manufacture so that the first and second transistors have characteristics which differ as little as possible from one another and, secondly, the placement on the same chip allows close thermal coupling.

Thus, with the objects of the invention in view there is also provided, a chip configuration, including:

a semiconductor chip having a power amplifier and a reference stage disposed thereon;

the power amplifier including a first transistor to be supplied with a supply voltage, the first transistor having a control input for receiving an input signal and a load connection for supplying an output signal;

the reference stage including a second transistor to be supplied with the supply voltage; and a control amplifier having an operational amplifier, the operational amplifier having an input and an output, the input being connected to the load connection of the first transistor, the output being connected to the control input of the first transistor; and the second transistor being connected to the operational amplifier for supplying a reference voltage to the operational amplifier.

According to another feature of the invention, a first capacitor is connected to the control input of the first transistor such that the input signal can be supplied via the first capacitor; and a second capacitor is connected to the load connection of the first transistor such that the output signal can be derived with the second capacitor.

According to yet another feature of the invention, a third capacitor is connected between the output of the operational amplifier and the second input of the operational amplifier.

According to a further feature of the invention, the first and second transistors are field-effect transistors of the same transistor type.

According to another feature of the invention, the first and second transistors have substantially identical transconductances and substantially identical threshold voltages.

According to yet another feature of the invention, a high-impedance reference resistor is connected to the second transistor.

According to a further feature of the invention, the first and second transistors are bipolar transistors of the same transistor type.

According to another feature of the invention, wherein the first and second transistors have substantially identical static current gains and substantially identical differential current gains.

In a further, advantageous embodiment of the present invention, the threshold voltage (which is subject to manufacturing tolerances) of the first transistor can be trimmed by the control amplifier in that the second transistor, which is provided in the reference stage, has a high resistance to ground at its source connection, across which virtually all the threshold voltage is dropped. This reference voltage is used, via a connection between the reference stage and the operational amplifier, to compensate for tolerances in the threshold voltage of the first transistor.

Other features which are considered as characteristic for the invention are set forth in the appended claims.

Although the invention is illustrated and described herein as embodied in an amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
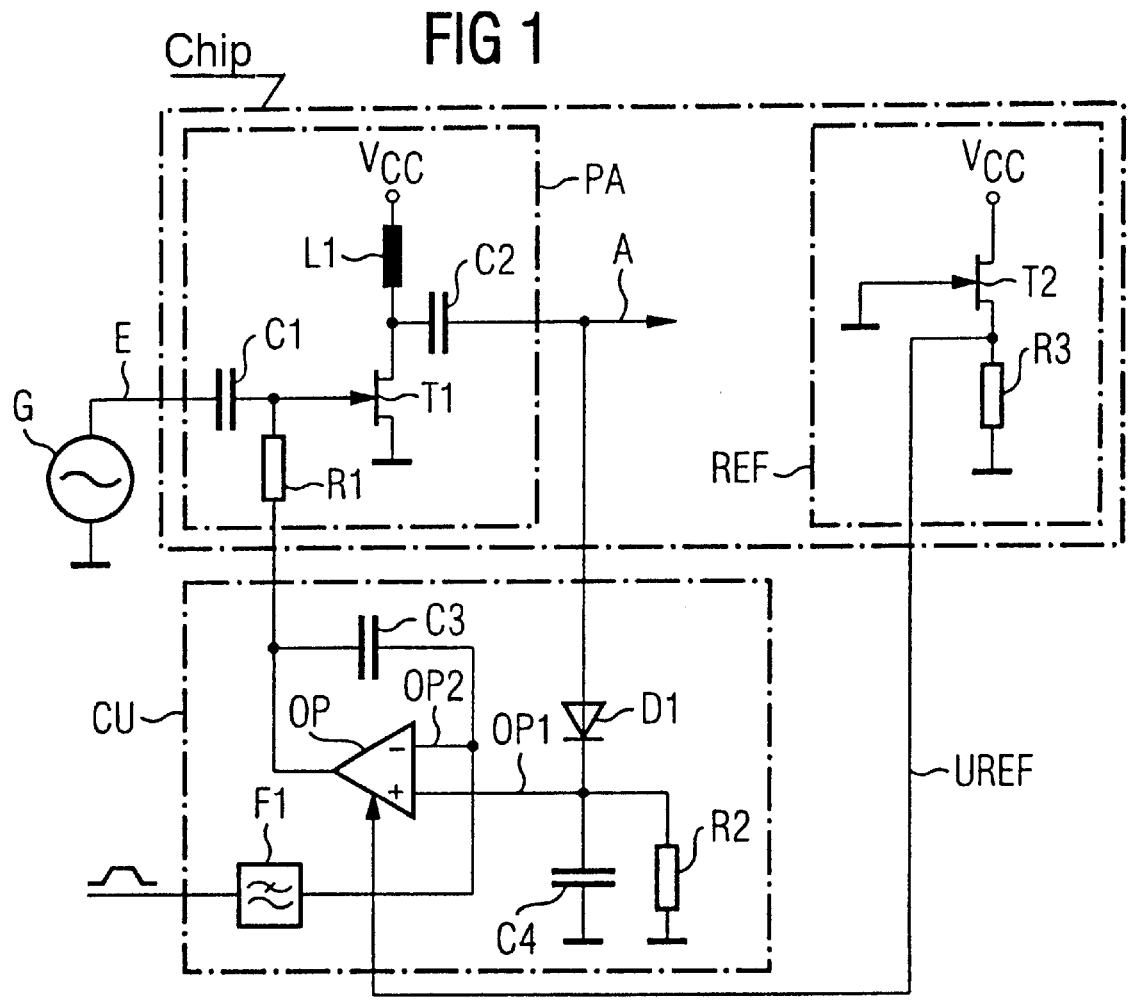
FIG. 1 is a simplified circuit diagram illustrating an exemplary embodiment of the invention.

Referring now to the figures of the drawings in detail and first, particularly, to FIG. 1 thereof, there is shown a basic circuit configuration having a radio-frequency or high-frequency amplifier PA. Such a radio-frequency amplifier is used, for example, as a transmit amplifier in mobile radio applications. The signal-amplifying transistor T1 in the present example is in the form of a field-effect transistor.

This field-effect transistor can be connected to a voltage source $V_{CC}$ via a coil L1 for radio-frequency decoupling.

From an input signal generator G an input signal E, which is to be amplified, can be supplied firstly, decoupled via a first capacitor C1, to the gate of the transistor. The amplified signal can be tapped off at the output of the transistor as the output signal A once again decoupled via a capacitor C2, and can be supplied to a load, for example a transmit antenna.

The control input of the field-effect transistor T1 can also be supplied via a resistor R1 with a control signal which is used to preset the power of the radio-frequency amplifier by the regulator CU. This power presetting takes place essentially by setting the operating point of the field-effect transistor T1. The control amplifier CU has an operational amplifier OP at whose output the control signal for the radio-frequency amplifier PA can be tapped off.

The operational amplifier OP can be supplied with a reference signal or desired value signal which includes the power preset for the radio-frequency amplifier PA. This reference signal, in the present example, can be supplied, via a low pass filter F1, to the "−" input OP2 of the operational amplifier OP, to which a feedback loop, which may have an integrating capacitor C3, can also be connected.

The output signal A from the radio-frequency amplifier PA is connected via a diode D1 to the "+" input OP1 of the operational amplifier OP. A capacitor C4 is also connected between the diode D1 and the operational amplifier input OP1, and a resistor R2 is connected in parallel with the capacitor C4 to earth, in order to produce a low-pass filter. In this way, the power signal which can be tapped off at the output of the radio-frequency amplifier is converted to a voltage level which can be processed by the operational amplifier.

A reference stage, which has a second transistor T2, is provided to compensate for tolerances in the transistor T1. The transistor T2 in this reference stage is physically equivalent to the transistor T1. The transistor T2 is of the same type as the transistor T1, but is scaled. In particular, the transistor T2 has the same electrical DC characteristics as the transistor T1.

The present exemplary embodiment is used to compensate for tolerances in the threshold voltage of the field-effect transistor T1. For this purpose, the source connection of the reference transistor T2 has a resistor R3 connected to ground across which, provided the resistor R3 is chosen to have a high resistance, virtually all the threshold voltage $U_{TO}$ drops. This reference voltage UREF is supplied via a line to the operational amplifier OP, where it is used to compensate for the tolerances.

In the present exemplary embodiment, the regulator CU is provided on a silicon basis, and the power amplifier PA and the reference stage REF both use either GaAs technolgy or HBT (Hetero-Bipolar-Transistor) technology.

Figure 2:
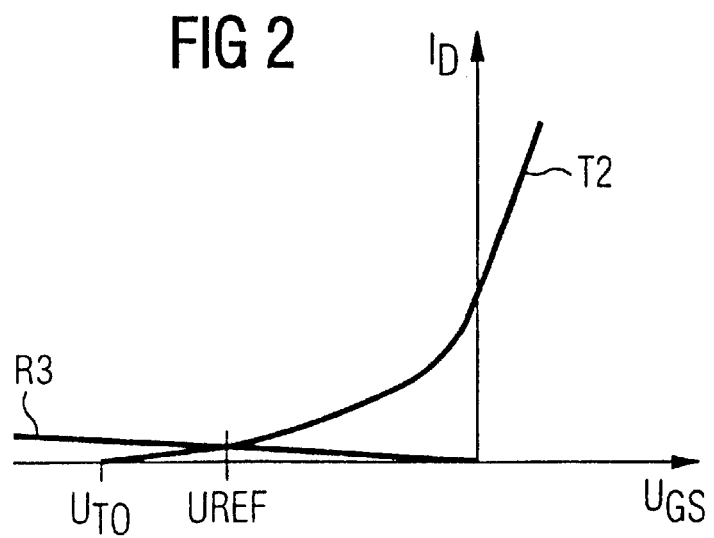
FIG. 2 is a graph illustrating the operating point setting of the reference stage.

FIG. 2 shows the transfer characteristic of a field-effect transistor, T2, namely the drain current $I_D$ as a function of the gate-source voltage $U_{GS}$. FIG. 2 also shows the resistance characteristic of the reference resistor R3. The intersection of the two characteristics leads to the reference voltage UREF which can be tapped off. As can be seen, the reference voltage UREF which can be tapped off from the circuit corresponds more accurately to the threshold voltage $U_{TO}$ of the field-effect transistor T2 the higher the resistance chosen for the resistor R3.

Particular advantages result by providing the transistor T1 and the transistor T2 on the same chip, since this allows good matching and good thermal coupling to be achieved. This is indicated by the dashed line in FIG. 1 by the power amplifier PA and reference stage REF.

In modifications of the present example of a circuit configuration, the reference voltage UREF could also be generated in a reference circuit in which the resistor R3 is replaced by a constant-current source. Furthermore, the current could also be applied or impressed to the drain side instead of to the source side, by using further control amplifiers. The current flowing in the reference stage need not necessarily be very small, since the reference voltage UREF is still well correlated with the threshold voltage even if the currents are higher.

In modifications of the exemplary embodiment, a current may also be used as a reference variable instead of using a voltage signal UREF for referencing, for example by the reference resistor R3 itself being part of the inverting part of the operational amplifier OP for producing a quiescent signal or rest signal.

In further modifications of the present exemplary embodiment, the transistors T1, T2 could also be bipolar transistors. In this case, the compensation for manufacturing tolerances could relate to the DC gain B or to the small-signal gain β.

When using HBT technology, the inception voltage, which corresponds to the threshold voltage, of the transistors could also be compensated for by using the described principle.

We claim:

1. An amplifier circuit, comprising:
    a power amplifier having a first transistor to be supplied with a supply voltage, said first transistor having a control input for receiving an input signal and a load connection for supplying an output signal;
    a control amplifier having an operational amplifier, said operational amplifier having an input and an output, said input being connected to said load connection of said first transistor, said output being connected to said control input of said first transistor;
    a reference stage having a second transistor to be supplied with the supply voltage, said second transistor being connected to said operational amplifier for supplying a reference voltage to said operational amplifier;
    a first capacitor connected to said control input of said first transistor such that the input signal can be supplied via said first capacitor; and
    a second capacitor connected to said load connection of said first transistor such that the output signal can be derived with said second capacitor.

2. The amplifier circuit according to claim 1, wherein said first and second transistors form a semiconductor chip configuration.

3. An amplifier circuit, comprising:
    a power amplifier having a first transistor to be supplied with a supply voltage, said first transistor having a control input for receiving an input signal and a load connection for supplying an output signal;
    a control amplifier having an operational amplifier, said operational amplifier having an input and an output, said input being connected to said load connection of said first transistor, said output being connected to said control input of said first transistor, said operational amplifier further having a further input, and a capacitor connected between said output of said operational amplifier and said further input of said operational amplifier; and
    a reference stage having a second transistor to be supplied with the supply voltage, said second transistor being connected to said operational amplifier for supplying a reference voltage to said operational amplifier.

4. The amplifier circuit according to claim 1, wherein:
    said operational amplifier has a further input; and
    a third capacitor is connected between said output of said operational amplifier and said further input of said operational amplifier.

5. The amplifier circuit according to claim 1, wherein said first and second transistors are field-effect transistors of a same type.

6. The amplifier circuit according to claim 5, wherein said first and second transistors have substantially identical transconductances and substantially identical threshold voltages.

7. The amplifier circuit according to claim 1, including a high-impedance reference resistor connected to said second transistor.

8. The amplifier circuit according to claim 1, wherein said first and second transistors are bipolar transistors of a same type.

9. The amplifier circuit according to claim 8, wherein said first and second transistors have substantially identical static current gains and substantially identical differential current gains.

10. A chip configuration, comprising:
    a semiconductor chip having a power amplifier and a reference stage disposed thereon;
    said power amplifier including a first transistor to be supplied with a supply voltage, said first transistor having a control input for receiving an input signal and a load connection for supplying an output signal, said power amplifier further having a first capacitor connected to said control input of said first transistor such that the input signal can be supplied via said first capacitor, and a second capacitor connected to said load connection of said first transistor such that the output signal can be derived with said second capacitor;
    said reference stage including a second transistor to be supplied with the supply voltage; and
    a control amplifier having an operational amplifier, said operational amplifier having an input and an output, said input being connected to said load connection of said first transistor, said output being connected to said control input of said first transistor; and said second transistor being connected to said operational amplifier for supplying a reference voltage to said operational amplifier.

11. The amplifier circuit according to claim 3, wherein said first and second transistors form a semiconductor chip configuration.

12. An amplifier circuit, comprising:

a power amplifier having a first transistor to be supplied with a supply voltage, said first transistor having a control input for receiving an input signal and a load connection for supplying an output signal;

a control amplifier having an operational amplifier, said operational amplifier having an inverting input, a non-inverting input, a control input, and an output, said non-inverting input connected to said load connection of said first transistor, said output connected to said control input of said first transistor, said inverting input for receiving a power preset signal; and a reference stage having a second transistor to be supplied with the supply voltage, said second transistor connected to said control input of said operational amplifier for supplying a reference voltage to said operational amplifier.

* * * * *